United States Patent [19]

Sloan

[11] Patent Number: 4,593,209
[45] Date of Patent: Jun. 3, 1986

[54] READ HEAD FOR WIEGAND WIRE

[75] Inventor: Carroll D. Sloan, Ambler, Pa.

[73] Assignee: Echlin Inc., Branford, Conn.

[21] Appl. No.: 613,635

[22] Filed: May 24, 1984

[51] Int. Cl.⁴ ......................... G11C 11/04; H03K 3/45
[52] U.S. Cl. .................................. 307/419; 360/110; 360/115; 360/112; 360/118; 365/133
[58] Field of Search ........................ 307/419; 365/133; 360/84, 83, 84, 88, 110, 112, 123, 125, 115, 118

[56] References Cited

U.S. PATENT DOCUMENTS

| | | | |
|---|---|---|---|
| 3,893,187 | 7/1975 | Kanai et al. | 360/125 X |
| 4,058,846 | 11/1977 | Knutson et al. | 360/118 |
| 4,118,747 | 10/1978 | Hanaoka et al. | 360/123 X |
| 4,247,601 | 1/1981 | Wiegand | 428/611 |
| 4,263,523 | 4/1981 | Wiegand | 307/419 |
| 4,264,939 | 4/1981 | Takii et al. | 360/118 |
| 4,309,628 | 1/1982 | Wiegand | 365/133 X |
| 4,387,410 | 6/1983 | Takanohashi et al. | 360/125 X |
| 4,400,752 | 8/1983 | Chabrolle | 360/112 |
| 4,484,090 | 11/1984 | Wiegand et al. | 365/133 X |

Primary Examiner—William M. Shoop, Jr.
Assistant Examiner—Shik Luen Paul Ip
Attorney, Agent, or Firm—McAulay, Fields, Fisher, Goldstein & Nissen

[57] ABSTRACT

A read head for a Wiegand Wire has a low reluctance core on which a pick-up coil is wound. The Wiegand Wires are passed over a face of the core and coil and switch state directly over the core and coil so that the change in the magnetic field is coupled to the coil to produce an output pulse. Outboard of the direction in which the Wiegand Wires travels are first and second magnets that generate the field. In contact with these magnets and bridging both sides of the coil are first and second magnetic shunt members which control and determine the shape of the field. A first magnetic shunt member has a relatively narrow bridge portion which saturates under the field involved and thus there is a large leakage field adjacent to the face of the read head for the purpose of appropriately setting the Wiegand Wires. The second shunt has a much larger bridge portion so that there is much less leakage flux. However this smaller leakage flux is in the opposite direction from the leakage flux from the first shunt. The leakage flux from the second shunt serves to establish, accordingly, a negative field having a magnitude sufficient to reset the Wiegand Wire. In this fashion the two magnets and two shunts determine the strength and configuration of the field.

5 Claims, 6 Drawing Figures

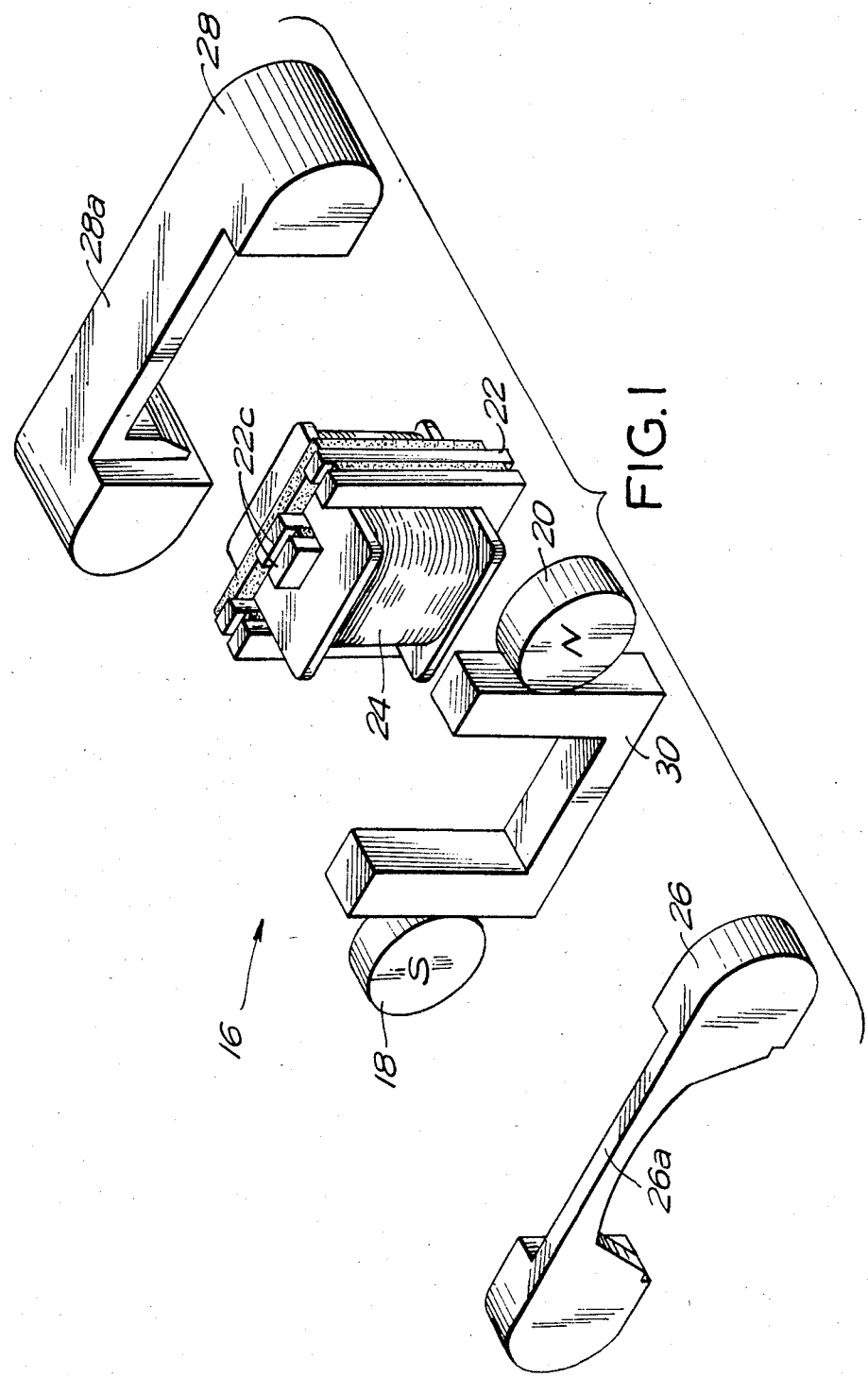

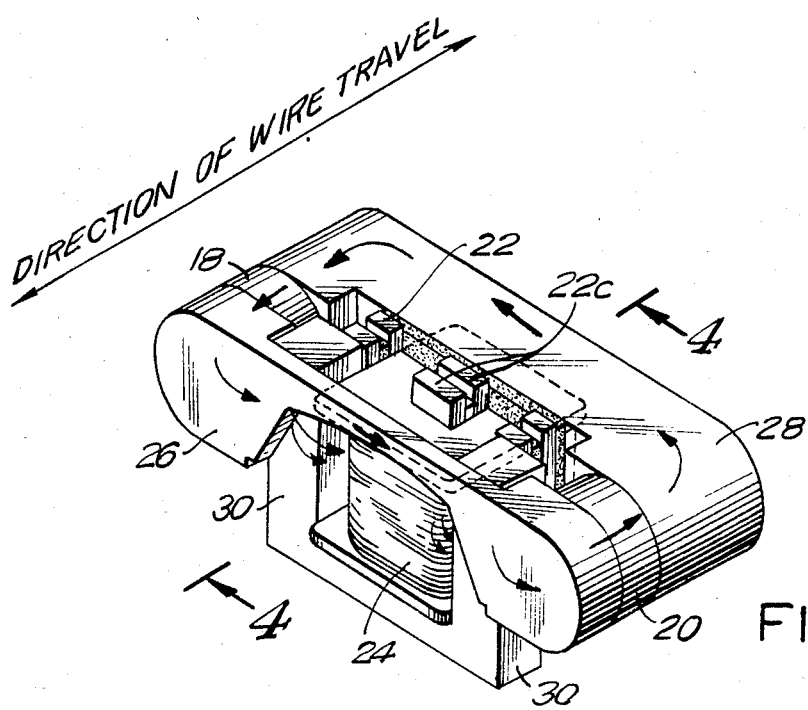
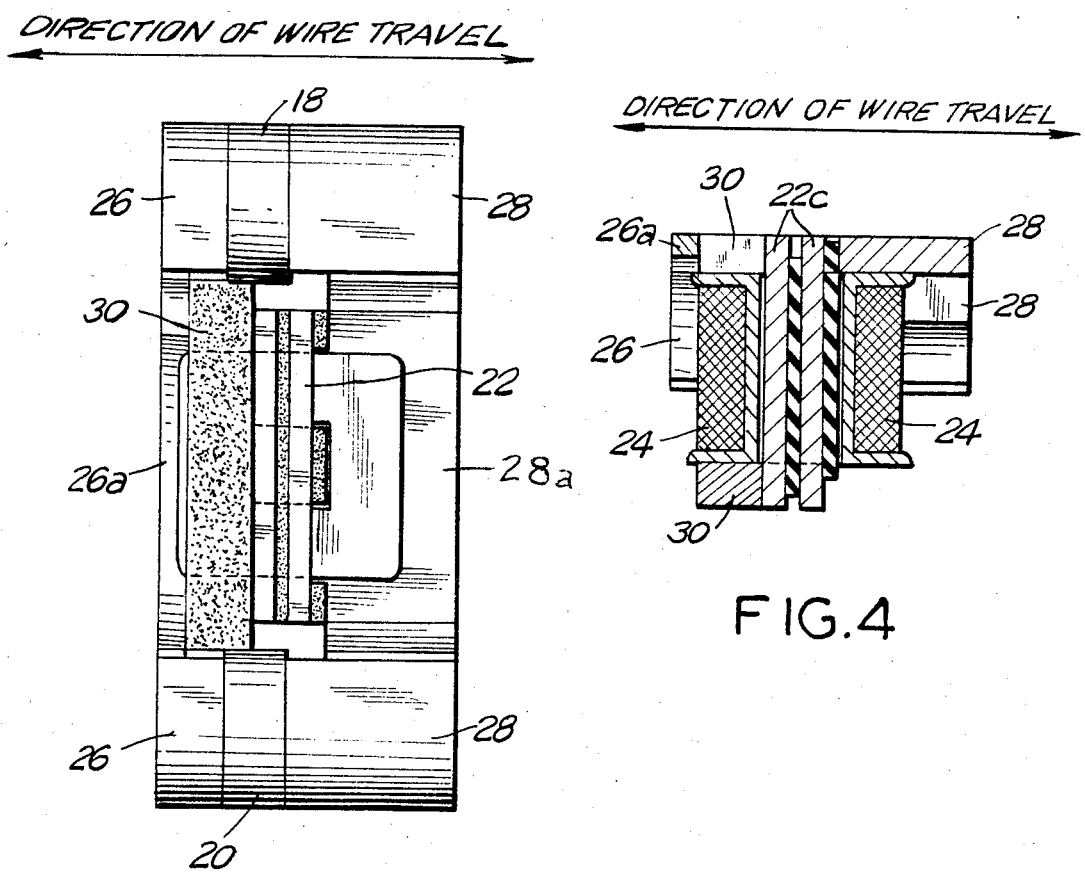

READ HEAD FOR WIEGAND WIRE

BACKGROUND OF THE INVENTION

This invention relates to a read head for providing an electrical pulse in response to a switch in state of the magnetic wire known as Wiegand Wire. The Wiegand Wire is a ferro magnetic wire having core and shell portions with divergent magnetic properties. These wires have come to be known in the art as Wiegand Wires. The currently preferred type of Wiegand Wire is disclosed in U.S. Pat. No. 4,247,601 issued on Jan. 27, 1981 to John Wiegand. A read head which is effective to provide an output pulse from the switch in state of the Wiegand Wire is described in U.S. Pat. No. 4,263,523 issued Apr. 21, 1981.

The wire switches state when the magnitude of an external magnetic field passes a threshold value.

One of the objects in the design of a read head is to establish the external field such that the threshold field is properly positioned immediately adjacent to the pick-up coil. Then when the Wiegand Wire switches state, there will be a maximum coupling of the changing magnetic field to the pick-up coil.

Another object in the design of a read head for use with the Wiegand Wire is to provide as compact a read head as possible so that the number of applications in which it may be employed is maximized. For example, the use of a Wiegand Wire in access cards and keys involves a large variety of environments and dimensional circumstances. The narrower the read head, the more readily can a particular installation adapt to the use of a Wiegand Wire encoded access card or access key.

The smaller the read head structure, the greater will the Wiegand Wire itself influence or distort the external field generated by the read head. One of the main factors in limiting the density in which the Wiegand Wire bits can be deployed in an access card or access key is the influence of the Wiegand Wire itself on the magnetic field generated by the read head.

Accordingly, the major objects of this invention are to provide a more compact read head with a more controlled external field that is less influenced by the passage across the read head of the Wiegand Wire being read.

A related purpose is to provide a read head design which will permit a closer deployment of the individual bits represented by each Wiegand Wire.

BRIEF DESCRIPTION

In brief, one embodiment of this invention involves a low reluctance E-core having a pick-up coil wound around the center leg. This E-core and pick-up coil structure is similar to that in the prior art read heads. The face of the core over which the Wiegand Wire passes is defined by the ends of the three legs of the E-core.

Outboard of the two end legs of the E-core are two high intensity magnets. The magnetic fields of these two magnets are coupled to one another through first and second shunts deployed along the sides of the E-core. The two magnets and the two shunts define a center opening in which the E-core and pick-up coil are positioned.

Leakage flux from these two shunts generates the field in the plane along which the Wiegand Wire passes. This plane is parallel to the face of the E-core and spaced as close to the E-core face as feasible.

On one side of the E-core, the shunt is relatively thick. On the other side of the E-core, the shunt is relatively thin. Thus the leakage field is relatively great along the thin shunt and relatively small along the thick shunt. The leakage fields are also in opposite directions so that if the relatively strong leakage field is deemed to be in a positive direction, the relatively weak leakage field is in a negative direction.

The result is to establish a field which passes through zero and goes sufficiently negative so as to switch the wire from a confluent state to a reverse state. This is also known as resetting the wire. This setting occurs at the read head at a position spaced from the center line of the E-core and pick-up coil. At the center of the E-core and pick-up coil, the resultant field is sufficiently positive so that the wire is switched back into its confluent state which is also known as setting the wire. This switching of the wire from its reverse state to its confluent state produces the substantial output pulse which it is the purpose of this read head to detect and to generate.

THE DRAWINGS

FIG. 1 is an exploded view of one embodiment of the read head of this invention showing the relative size and configuration of the two shuts.

FIG. 2 is a perspective view of the assembled read head having the components as shown in FIG. 1. FIG. 2 illustrates the face of the read head over which the Wiegand Wire being switched and read passes during the reading process. The path of the flux generated by the magnets 18 and 20 is suggested by the path of the arrows set forth in FIG. 2.

FIG. 3 is a view of the surface of the FIG. 2 read head that is opposite from the reading surface shown in FIG. 2.

FIG. 4 is a cross sectional view along the plane 4—4 taken through the FIG. 2 read head.

Figure 5:
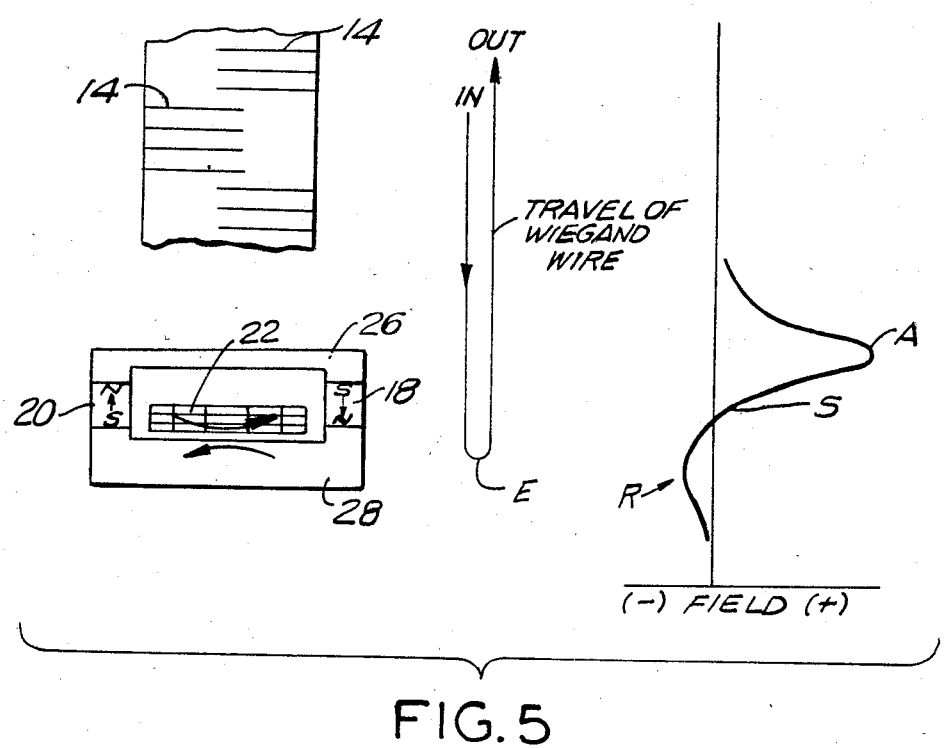

FIG. 5 is a schematic representation of the face of the read head showing the positioning of a code strip of Wiegand Wires to be passed over the read head. FIG. 5 includes a graph showing the relative field strength and direction that is seen by each wire as it passes over the face of the read head. The graphical representation of the field is drawn in alignment with the position over the read head where the field is developed.

The FIGS. 1 through 5 arrangement is adapted to be used where a Wiegand Wire is passed over the read head and then withdrawn.

Figure 6:
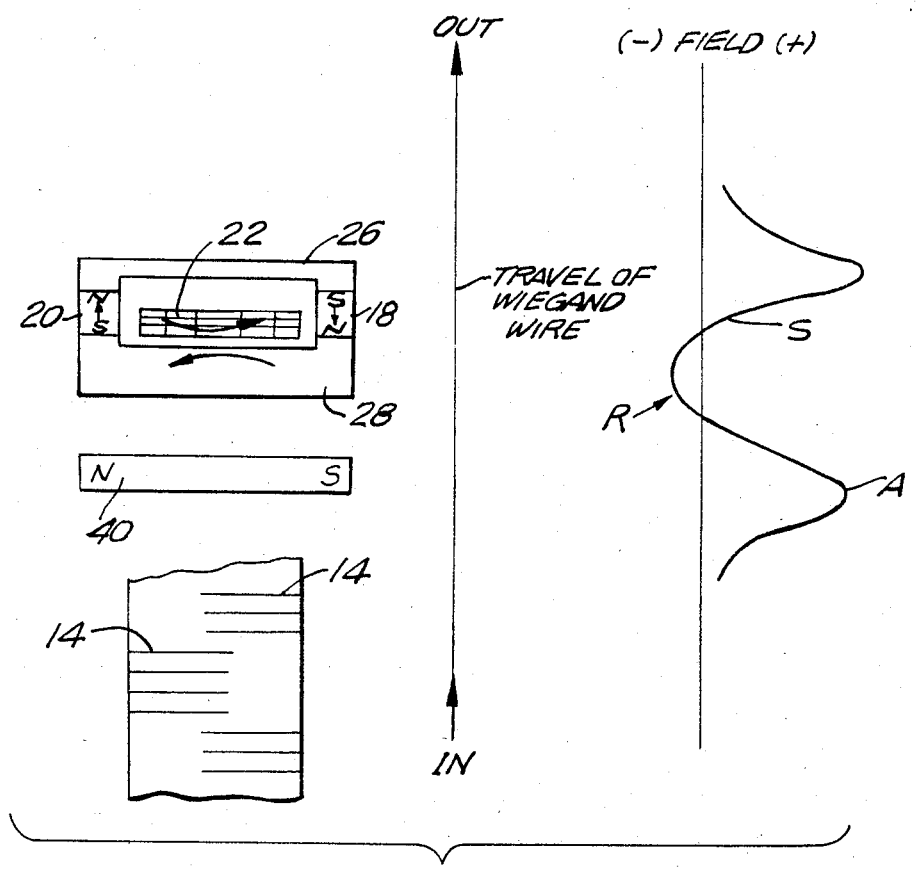

FIG. 6 is a schematic illustration similar to that of FIG. 5 showing an embodiment of this invention adapted to be employed to read a code strip of Wiegand Wires which is passed through over the read head.

DESCRIPTION OF THE PREFERRED EMBODIMENTS

The magnetic field configuration shown in the figures is adapted to the wire disclosed in U.S. Pat. No. 4,247,601. When the wire 14 is subjected to a substantial external field, (for example, 100 Oersteds) the entire wire will be magnetized in a direction dictated by the field. From the point of view of the polarization and flux arrangement, this is quite similar to the arrangement of a bar magnet. This state is called herein the confluent state. When the wire in the confluent state is subjected to a relatively weak field (for example, 20

Oersteds) in the opposite direction, the wire will switch to the reverse state. In the reverse state it has opposed directions of magnetization for the core and shell zones so that the flux path is substantially completed through the wire rather than through the air outside of the wire. When the wire in the reverse state is subjected to a positive field of, for example, about 20 Oersteds, it switches back to its confluent state. It is this change of state from reverse to confluent that results in a substantial change in the magnitude of flux through the air outside the wire. Accordingly, an adjacent pick-up coil is subjected to a change in flux when the wire changes state. It is this change in flux which induces a pulse in the pick-up coil.

The read head 16 includes first and second magnets 18 and 20, a laminated E-shaped core 22 and a pick-up coil 24 that is wrapped around the center leg 22c of the E-core 22. The magnets 18 and 20 are positioned, relative to the path of the Wiegand Wire, outboard of the core 22 and coil 24. In addition, first and second magnetic shunts 26, 28 are positioned in contact with the faces of the magnets 18, 20 to provide a shunt path for the flux from the magnets 18 and 20. As indicated, the directions of polarization of the magnets 18 and 20, in terms of the closed loop of magnetic flux, are in series aiding. Each shunt 26, 28 has two portions which contact the magnets 18 and 20, which portions are connected by a bridge 26a, 28a respectively.

The two shunts 26 and 28 are substantially different in size. Because of the relatively narrow bridge 26a of the smaller shunt 26 a substantial amount of leakage of flux occurs thereby generating a relatively substantial magnetic field adjacent to the shunt 26 at the face of the read head. The substantially larger shunt 28 has a much smaller leakage flux and thus establishes a field adjacent to the shunt 28 at the face of the read head which is smaller in absolute magnitude than is the field established through the small shunt 26.

Also, because of the direction of magnetization of the two magnets 16 and 18, the direction of the field adjacent to the smaller shunt 26 is opposite to the direction of the field adjacent to the larger shunt 28. The field adjacent to the shunt 26 will arbitrarily be called a positive field herein and thus the field adjacent to the shunt 28 is a negative field. Relative magnitudes of these fields are sketched in FIG. 5.

In one embodiment, the two magnets 18 and 20 are samarium cobalt magnets one-quarter inch in diameter and one-tenth of an inch thick. In that embodiment the smaller shunt 26, which produces the saturation field and the set field, has a bridge 26a which is 35 mils thick and 35 mils deep at its narrowest point. This bridge 26a may be shaped somewhat to affect the shape of the field. Because this shunt 26a saturates along the bridge portion 26a, it operates more as a flux guide than as a shunt.

In that embodiment, the larger shunt 28 which serves to establish the reset field, has a bridge 28a which is 220 mils thick and 60 mils deep.

In that embodiment, a surface of each shunt 26 and 28 and the ends of the three legs of the E-core 22 are substantially co-planar, thereby defining the reading surface of the read head.

The nonmagnetic U-shaped spacer 30 serves to properly position the E-Core 22 so that the longitudinal center line of the E-Core is positioned at the point in the field where the Wiegand Wire, which has been reset, switches back from its reset or reverse state to its set or confluent state. The relatively narrow bridge 26a of the smaller shunt 26 requires that the spacer 30 be employed to assure the proper positioning of the pick up coil 24.

This shunt mechanism 26 and 28 in contact with the magnets 18 and 20 and surrounding the coil 24 and core 22 serves to create a compact field in which the field gradiant is steep. That is, as the wire passes across the face of the read head, the field to which it is exposed changes at a fairly rapid rate. This high gradiant means that the zone within which the various Wiegand Wires change state can be held narrow. This assures that the degree of coupling between the switching Wiegand Wire and the coil is much more constant from wire to wire and thus the output pulse is much more constant and more reliable. Thus because of the more controlled external field with a higher gradiant at the zone of switching, a more compact read head can be provided than previously was the case.

The manner in which the Wiegand Wires are encoded on a code strip that may be carried by an access card is described in connection with the discussion of FIG. 4 in U.S. Pat. No. 4,263,523 issued Apr. 21, 1981 to John R. Wiegand and thus need not be discussed in detail here. However, it probably will aid in understanding to recognize that the "zero" bit wires are all in line with one another and are displaced from the "one" bit wires are which in turn are all in line with one another. When a zero bit wire switches state immediately under the center of the read head, the flux change is coupled in a "clockwise" direction through one leg of the E-Core 22 and the center leg 22c of the E-Core. This results in flux through the coil 24 changing in a first direction. When a one bit switches, a comparable clockwise flux change is coupled through the other leg of the E-Core and the center leg 22c. The result is a flux change in the second or opposite direction through the center leg 22c and coil 24. The result is that an output pulse in a first direction is produced in response to the switching of a zero bit and an output pulse in the other direction is produced in response to the switching of a one bit.

FIG. 5 illustrates how this read head operates in an adaptation where the access card to be read is inserted into and under the read head and then withdrawn. Each Wiegand Wire 14 travels under the read head to an end point E which is determined by a mechanical stop and is then withdrawn. As the particular Wiegand Wire 14 moves under the reading face of the read head, it is first magnetized in a predetermined direction by a saturating magnetic field at the point A over the smaller shunt 26. This assures that the shell and core are magnetized in a predetermined direction. As the wire 14 continues to pass across the read head, there is no change in the state of the wire 14 until it is close to the end point E of its travel. By that point it has been subjected to a field of opposite polarity which is sufficiently strong to reset the wire. In this reset state, with the core and shell having substantially opposed magnetization directions, the wire is withdrawn from over the read head. As the wire passes directly over the center of the E-core 22, the wire is subjected to a sufficiently positive field value, the set value at the point S, so that the wire switches into its confluent or set state. This switching into its set state produces the change of magnetic field which is coupled through the coil 24 and produces an output pulse.

FIG. 6 illustrates a pass through read head embodiment. The FIG. 6 arrangement is similar to that of the embodiment of FIGS. 1 through 5 except that a setting magnet 40 is employed upstream from the read head proper in order to provide an initial saturating field to assure that the entire Wiegand Wire is magnetized in a desired direction prior to being subjected to the reset and set operations that serve to generate the output pulse. A main difference between the FIG. 6 embodiment and the FIG. 5 embodiment is the positioning of the setting magnet 40 as shown. This results in a modification of the field to which the Wiegand Wire is exposed as can be seen by comparing the field diagrams in FIGS. 5 and 6.

To recapitulate, the FIG. 5 embodiment is used in connection with an access card reader in which the card is inserted across the read head and then withdrawn. The FIG. 6 embodiment is used in connection with an access card reader where the card is passed through across the read head.

It should be kept in mind that the representations of FIGS. 5 and 6 are schematic, simplified and somewhat idealized. In a practical embodiment, the positive field may go as high as 300 Oersteds. However, the point S which is the pulse firing point (the point at which the Wiegand Wire switches from its reverse state to its confluent state) is at about 20 to 30 Oersteds. The negative field, or reset field, may have a magnitude that goes as high as about 45 Oersteds. However, the reset firing point (at which the Wiegand Wire switches from its confluent state to its reverse state) is probably about 20 Oersteds. It is difficult to measure these set and reset firing points accurately. It might also be noted that the reset firing occurs right over the shunt 28 and thus any external field change generated by this reset firing will be absorbed by this larger, nonsaturated, shunt 28. In that embodiment it has been found desirable to have the zero cross over point of the field about one-third of the way up along the laminated stack that constitutes the E-core 22. This assures that the approximately 20 Oersted set pulse firing point is centered under the E-core 22. However, it should be understood that the precise dimensioning and positioning of all these elements is a function of the relative values of the magnets 18, 20 and the effective reluctance of the shunts 26 and 28.

What is claimed is:

1. A read head for use with a Wiegand Wire where a pick-up coil on a core responds to the field change generated from a switch in state of the Wiegand Wire to provide an output pulse, comprising:
   first and second magnets outboard of the pick-up coil and core, the magnetization of said magnets being in substantially opposite directions,
   a first magnetic field shunt coupling a first face of said first magnet to a first face of said second magnet, said first faces of said first and second magnets having opposite polarities,
   a second magnetic field shunt coupling a second face of said first magnet to a second face of said second magnet, said second faces of said first and second magnets having opposite polarities,
   said first shunt providing substantially greater magnetic reluctance than said second shunt so that the leakage flux along the face of said read head from said first shunt is substantially greater than the leakage flux along the face of said read head from said second shunt.

2. The read head of claim 1 wherein:
   said first magnetic shunt has a first portion in contact with a face of said first magnet having a first polarity and a second portion in contact with face of said second magnet having a second polarity, and
   said second magnetic shunt has a first portion in contact with a face of said first magnetic having said second polarity and a second portion in contact with a face of said second magnet having said first polarity.

3. The read head of claim 2 wherein said first and second portions of said first shunt are connected by a first bridge and said first and second portions of said second shunt are connected by a second bridge, the cross sectional area of said second bridge being substantially greater than the cross sectional area of said first bridge.

4. A read head for use with a Wiegand Wire where a pick-up coil on a core responds to the field change generated from a switch in state of a Wiegand Wire moving from a first position to a second position under the read head to provide an output pulse, comprising:
   magnet means positioned adjacent to the pick-up coil and core to provide magnetic fields in opposed first and second directions at said first and second positions respectively under said read head, and
   magnetic field shunt means coupled to said magnet means to control the magnitude of the field at said first and second positions provide a larger flux in said first direction at said first position and a smaller flux in a second direction at said second position.

5. The read head of claim 4 wherein said shunt means is in contact with said magnet means and the magnitude of said field at said first position is sufficient to set the Wiegand Wire while the magnitude of said field at said second position is sufficient to reset the wire.

* * * * *